(12) United States Patent
Goldbach et al.

(10) Patent No.: US 9,236,482 B2
(45) Date of Patent: Jan. 12, 2016

(54) SEMICONDUCTOR DEVICE WITH FIELD-INDUCING STRUCTURE

(71) Applicant: GLOBALFOUNDRIES Inc., Grand Cayman (KY)

(72) Inventors: Matthias Goldbach, Dresden (DE); Martin Trentzsch, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/711,029

(22) Filed: May 13, 2015

(65) Prior Publication Data

US 2015/0243789 A1  Aug. 27, 2015

Related U.S. Application Data

(62) Division of application No. 13/936,624, filed on Jul. 8, 2013, now Pat. No. 9,064,900.

(51) Int. Cl.
| | |
|---|---|
| *H01L 29/02* | (2006.01) |
| *H01L 29/78* | (2006.01) |
| *H01L 29/66* | (2006.01) |
| *H01L 21/8238* | (2006.01) |
| *H01L 27/092* | (2006.01) |
| *H01L 29/06* | (2006.01) |

(52) U.S. Cl.
CPC .... *H01L 29/7851* (2013.01); *H01L 21/823821* (2013.01); *H01L 27/0924* (2013.01); *H01L 29/0607* (2013.01); *H01L 29/66795* (2013.01); *H01L 29/66818* (2013.01); *H01L 29/785* (2013.01)

(58) Field of Classification Search
CPC ............ H01L 29/785; H01L 29/66795; H01L 21/823821
USPC ........................... 257/402; 438/157, 283, 592
See application file for complete search history.

(56) References Cited

U.S. PATENT DOCUMENTS

| | | | |
|---|---|---|---|
| 2005/0227435 A1* | 10/2005 | Oh et al. ......................... | 438/257 |
| 2008/0191286 A1* | 8/2008 | Chang et al. ................... | 257/369 |
| 2009/0057765 A1 | 3/2009 | Zhu et al. | |
| 2010/0148234 A1* | 6/2010 | Torek et al. ..................... | 257/296 |
| 2012/0211808 A1* | 8/2012 | Wei et al. ........................ | 257/288 |
| 2014/0213048 A1 | 7/2014 | Sun et al. | |

* cited by examiner

*Primary Examiner* — Matthew Gordon
(74) *Attorney, Agent, or Firm* — Amerson Law Firm, PLLC

(57) ABSTRACT

The present disclosure provides for semiconductor device structures and methods for forming semiconductor device structures, wherein a field-inducing structure is provided lower than an active portion of a fin along a height dimension of that fin, the height dimension extending in parallel to a normal direction of a semiconductor substrate surface in which the fin is formed. The field-inducing structure hereby implements a permanent field effect below the active portion. The active portion of the fin is to be understood as a portion of the fin covered by a gate dielectric.

22 Claims, 9 Drawing Sheets

SEMICONDUCTOR DEVICE WITH FIELD-INDUCING STRUCTURE

CROSS-REFERENCE TO RELATED APPLICATION

This is a divisional of co-pending application Ser. No. 13/936,824, filed Jul. 8, 2013.

BACKGROUND OF THE INVENTION

1. Field of the Invention

The present disclosure generally relates to a method for forming a semiconductor device structure and to a semiconductor device structure. Particularly, the present disclosure relates to forming bulk fins comprising a field inducing structure and to according semiconductor device structures.

2. Description of the Related Art

Transistors, such as metal oxide semiconductor field effect transistors (MOSFETs) or simply field effect transistors (FETs) or MOS transistors, represent the core building blocks for a vast majority of semiconductor integrated circuits. Generally, a FET includes source and drain regions between which a current flow is controlled by applying a bias to a gate electrode overlying a channel region between the source and drain regions. Conventional integrated circuits (ICs), such as high-performance microprocessors, for example, may include a great number of FETs, usually on the order of millions. For such ICs, decreasing transistor size and, therefore, increasing integration density has traditionally been a high priority in the semiconductor manufacturing industry. Nevertheless, transistor performance must be maintained with decreasing transistor size.

A FinFET is a type of transistor that addresses reducing the transistor size while maintaining transistor performance. In general, FinFETs represent three-dimensional transistors formed by thin fins extending upwardly from a semiconductor substrate. In a FinFET, the transistor channel is formed along the vertical sidewalls of the fin, which is also frequently referred to as a double gate transistor, or along the vertical sidewall surfaces and the upper horizontal surface of the fin, leading to a so-called tri-gate transistor. Double gate transistors and tri-gate transistors have a wide channel and, hence, high performance, which may be achieved without substantially increasing the area of the substrate surface required by the transistors because a transistor's performance, often measured by its transconductance, is proportional to the width of the transistor channel.

When considering bulk fins having a bulk substrate formed below an active fin, the doping of the bulk substrate needs to be self-aligned with regard to the active fin. In case the doping of the bulk substrate is not exactly adjusted, such as not sufficiently well aligned with regard to the active fin, the so-called sub-threshold leakage is not controllable because a leakage current (drift current at a gate-source bias) present in the sub-threshold region (or weak inversion region) depends crucially on the threshold voltage and further also depends on the dopant concentration within the channel region. Conventionally, the doping of the bulk substrate is realized by implanting dopants or out-diffusing dopants into the bulk substrate. However, those concepts result in a dopant profile that reaches into the active fin, which at current advanced technology nodes induces unacceptable variations from required dopant concentration profiles.

For SOI fins, i.e., fins in an active region that is formed in a semiconductor layer on an isolating material substrate (so-called silicon-on-isolator configuration or SOI configuration), an increased variability of the threshold voltage due to sub-threshold leakage is avoided. The reason is that a bottom oxide or BOX layer is present under the fins such that a possible leakage path into the substrate as present in bulk fins is cut off in SOI configurations. In general, the mainstream technology focuses on bulk FinFET technologies, partially relying on the SOI FinFET configurations exhibiting other intrinsic issues.

According to recent approaches, efforts have been made to increase the gate area. As the minimal gate length is mandatory in logic related device technologies, this proposal turned out to lack compatibility with logic devices and is, therefore, only realized in the context of SRAM devices. One reason is that the minimal gate length is mandatory to keep the gate delay low and to enable fast designs for logic devices.

Currently, FinFETs are considered to provide the appropriate technology for future nodes for overcoming important issues for strongly-scaled semiconductor circuit structures, such as short channel effects, and for realizing high density designs which are required in current complex semiconductor applications. In the framework of FinFET technologies, a strong scaling can be realized by the fins providing a fully depleted body together with a multi-gate controlling of the channel regions.

In general, a reliable and precise control of the threshold voltage, and in particular a reduced variability of the threshold voltage across FinFETs formed on a semiconductor wafer, may only be achieved by at least strongly reducing, if not suppressing, random dopant fluctuations migrating into fins. In bulk configurations, the body below an active fin requires to be controlled such that almost no bulk leakage appears, which results in a degraded performance of FinFETs. Conventionally, the bulk leakage is controlled by appropriately doping the bulk below the fins by high doping processes.

However, the accordingly-used high doping of the bulk below the fin unavoidably introduces a source for random dopant fluctuations in the active fin because the required ideal doping profile can only be approximated by a smooth function with a tail reaching into the active portion of each fin, such that the tail affects the doping within the active portions of the fins. To this end, the threshold voltage of the FinFETs under fabrication is negatively affected, i.e., its variability is degraded. Especially for SRAM devices, a tight variability strongly relates to the performance of SRAM devices and conventional highly integrated SRAM devices are, therefore, expected to fail in complying presently-demanded dense standards with regards to performance, operation, speed and the like.

Therefore, it is desirable to provide methods for at least reducing, if not suppressing, random dopant fluctuations in current advanced FinFET structures. In particular, it is desirable to provide processes which avoid a random distribution of dopants within active fins during the processing of the fins.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides for semiconductor device structures and methods for forming semiconductor device structures, wherein a field-inducing structure is provided lower than an active portion of a fin along a height dimension of that fin, the height dimension extending in parallel to a normal direction of a semiconductor substrate surface in which the fin is formed. The field-inducing structure hereby implements a permanent field effect below the active portion. The active portion of the fin is to be understood as a portion of the fin covered by a gate dielectric.

In a first aspect of the present disclosure, a method for forming a semiconductor device structure is provided, the method including forming a fin on a semiconductor substrate, the fin having a height dimension parallel to a normal direction of a surface of the semiconductor substrate and having at least two opposing sidewall surfaces, providing a field-inducing structure on at least one lower first sidewall portion of the sidewall surfaces for inducing a field effect in the fin, and forming a gate structure on an upper second sidewall portion in each sidewall surface, wherein the at least one lower first sidewall portion is disposed lower than the upper second sidewall portions along the height dimension of the fin.

In a second aspect of the present disclosure, a method for forming a CMOS structure is provided, the method including providing a first active region and a second active region in a semiconductor substrate, each of the active regions including at least one fin, wherein each fin has a height dimension parallel to a normal direction of a surface of the semiconductor substrate and has at least two opposing sidewall surfaces, forming a first field-inducing structure on an upper portion of each fin for inducing a field effect in each fin, forming a masking structure over the first active region for masking the first active region, applying a first etching process through the masking structure for removing the first field-inducing structure in the second active region, forming a second field-inducing structure on an upper portion of each fin in the active region for inducing a field effect in each fin, removing the masking structure, applying a second etching process to each fin for forming an exposed upper portion for each fin, the upper portion having an exposed upper surface and exposed sidewall portions, wherein a field-inducing sidewall portion is formed lower than the exposed upper portion along the height dimension of each fin, and forming a gate dielectric layer on the exposed upper portion of each fin.

In a third aspect of the present disclosure, a semiconductor device structure is provided, the structure including a fin formed on a semiconductor substrate, the fin having a height dimension parallel to a normal direction of a surface of the semiconductor substrate and having at least two opposing sidewall surfaces, a field-inducing structure formed on at least one lower first sidewall portion for inducing a field effect in the fin, a gate dielectric layer formed on upper second sidewall portions such that the field-inducing structure is lower than the gate dielectric layer along the height dimension, and an insulating layer, wherein the field-inducing structure is embedded into the insulating layer.

BRIEF DESCRIPTION OF THE DRAWINGS

The disclosure may be understood by reference to the following description taken in conjunction with the accompanying drawings, in which like reference numerals identify like elements, and in which.

Figure 1A:
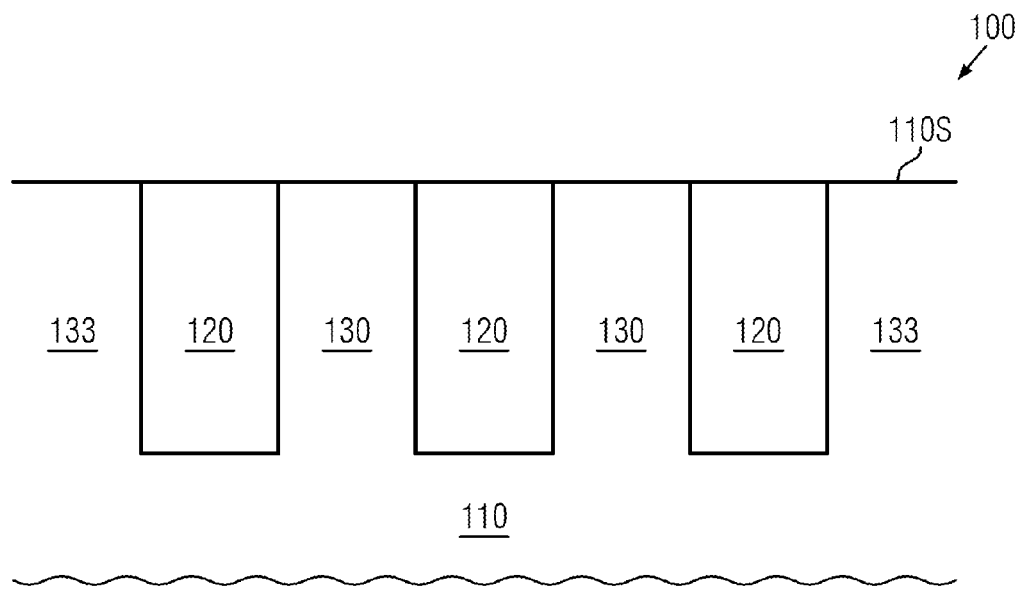
FIGS. 1a-1m schematically illustrate illustrative processes for forming FinFETs in accordance with various embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In general, integrated circuits (ICs) can be designed with millions of transistors. Many ICs are designed using metal oxide semiconductor (MOS) transistors, also known as field effect transistors (FETs) or MOSFETs. Although the term "MOS transistor" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. MOS transistors used in the design of ICs can be either planar MOS transistors or FinFETs, with each type of device having certain unique advantages and disadvantages. Both types of MOS transistors may be fabricated as P-channel transistors and as N-channel transistors and both may be fabricated with or without mobility enhancing stress features. A circuit designer can mix and match device types, using P-channel and N-channel, planar MOS and FinFET, stressed and unstressed, to take advantage of the best characteristics of each device type as they best suit the circuit being designed.

The present disclosure provides, in illustrative embodiments, FinFETs having a field-inducing structure formed below active portions of the fins for inducing a field effect in the fins.

In accordance with some illustrative embodiments of the present disclosure, a field-inducing structure may be provided by a charged oxide layer, wherein charges are incorporated into an oxide and are, therefore, fixed in the respective position. By way of example, one of lanthanum, barium, scandium, praseodymium, neodymium and aluminum may be incorporated into an oxide layer, the oxide layer comprising one of a silicon oxide, hafnium oxide, hafnium silicon oxide, hafnium silicon oxynitride, silicon nitride, zirconium oxide, zirconium silicon oxide and zirconium silicon oxynitride. Herein, an incorporation into an oxide layer may be achieved by an appropriate deposition process or alternatively by performing an appropriate implantation process. The charges may be fixed by an appropriate annealing process.

In some illustrative embodiments, a field-inducing structure may be provided with a cap structure for protecting the field-inducing structure during various etching and cleaning processes performed in some illustrative processes before forming a gate structure above the field-inducing structure over active portions of fins.

In accordance with some illustrative embodiments, an upper portion of a fin to be provided with a field-inducing structure may be shaped such that at least one dimension of the upper portion perpendicular to a height dimension of the fin is reduced. According to a special illustrative embodiment herein, the upper portion of the fin may be etched back relative to a lower portion of the fin such that upper sidewall surfaces of the lower portion are exposed at opposing sides of the upper portion of the fin. A field-inducing structure may be provided such that the field-inducing structure is at least partially formed on the upper portion.

When describing the following figures, methods for forming an integrated circuit (IC) and/or integrated circuits (ICs) in accordance with various exemplary embodiments of the present disclosure will become apparent to the person skilled in the art. The described process steps, procedures and materials are to be considered only as possible examples of embodiments designed to illustrate to one of ordinary skill in the art concepts for practicing the invention. However, it is to be understood that the invention is not to be limited to these exemplary embodiments. Illustrated portions of ICs may include only a single FinFET and an optional planar MOS transistor, although those of skill in the art will recognize that an actual IC may include a large number of such transistors.

Various illustrative embodiments of the invention are described below. In the interest of clarity, not all features of an actual implementation are described in this specification. It will, of course, be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make and use the invention. It is to be understood that other embodiments would be evident based on the present disclosure, and that system, structure, process or mechanical changes may be made without departing from the scope of the present disclosure. In the following description, numerous specific details are given to provide a thorough understanding of the disclosure. However, it will be apparent that the embodiments of the disclosure may be practiced without these specific details. In order to avoid obscuring the present disclosure, some well-known circuits, system configurations, structure configurations and process steps are not disclosed in detail.

The drawings showing embodiments of the present disclosure are semi-diagrammatic and are not to scale and, particularly, some of the dimensions are for clarity of presentation and are exaggeratedly shown in the figures. Similarly, although the views in the drawings generally show similar orientations for ease of description, this depiction in the figures is arbitrary for the most part. Generally, the embodiments of the disclosure may be operated in any orientation.

Multiple embodiments are disclosed and described having some features in common; for clarity and ease of illustration, description and comprehension thereof, similar and like features are ordinarily described with similar reference numerals as a matter of descriptive convenience. Various different embodiments are described with regard to one or more common figures as a matter of descriptive convenience. It is to be understood that this is not intended to have any other significance or provide any limitation for the present disclosure. Any numeration of embodiments and/or aspects, may it be explicit as $1^{st}$ embodiment and/or aspect, $2^{nd}$ embodiment and/or aspect, etc., or implied, is a matter of descriptive convenience and is not intended to provide any other significance or limitation for the present disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

Some illustrative embodiments of processes for forming semiconductor device structures and according semiconductor device structures will be apparent from the following description with regard to FIGS. 1a-1m.

FIG. 1a schematically illustrates, in a cross-sectional view, a semiconductor device structure 100 at an early phase of fabrication. The semiconductor device structure comprises a semiconductor substrate 110 having a surface 110S, wherein a plurality of fins 130 is formed in the surface 110S of the semiconductor substrate 110. As illustrated, each fin 130 is delineated by at least two trenches 120 disposed at opposing sides of the fin 130. In this regard, each fin 130 of the plurality of fins is separated from adjacent fins 130 by the trenches 120 formed in between two neighboring fins 130. In the illustration of FIG. 1a, the plurality of fins 130 is formed within the semiconductor substrate 110 such that the plurality of fins 130 is surrounded by surrounding regions 133. According to one illustrative example, the surrounding regions 133 may be provided by semiconductor material of the semiconductor substrate. Alternatively, the surrounding regions may be formed by shallow trench isolations or STI.

The plurality of fins 130 as illustrated in FIG. 1a may be formed by patterning the surface 110S of the semiconductor substrate 110 at an early stage of fabrication by a masking structure (not illustrated) wherein the masking structure provides a pattern in correspondence with the desired pattern of trenches 120 and/or fins 130. Subsequently, the trenches 120 may be formed through the masking pattern (not illustrated) for forming the plurality of fins 130. In accordance with an explicit example, the trenches 120 may be filled with an insulating material such that the trenches 120 are filled at least up to the level of the surface 110S of the semiconductor substrate 110. In case the trenches 120 are over-filled by the insulating material, a subsequent planarization step may be performed. However, the person skilled in the art will appreciate that this does not pose any limitation on the present disclosure and formation of at least one fin may comprise removing the surrounding regions 133. Alternatively, a fin may be formed on a surface of a semiconductor substrate by appropriately depositing a semiconductor material.

Figure 1B:
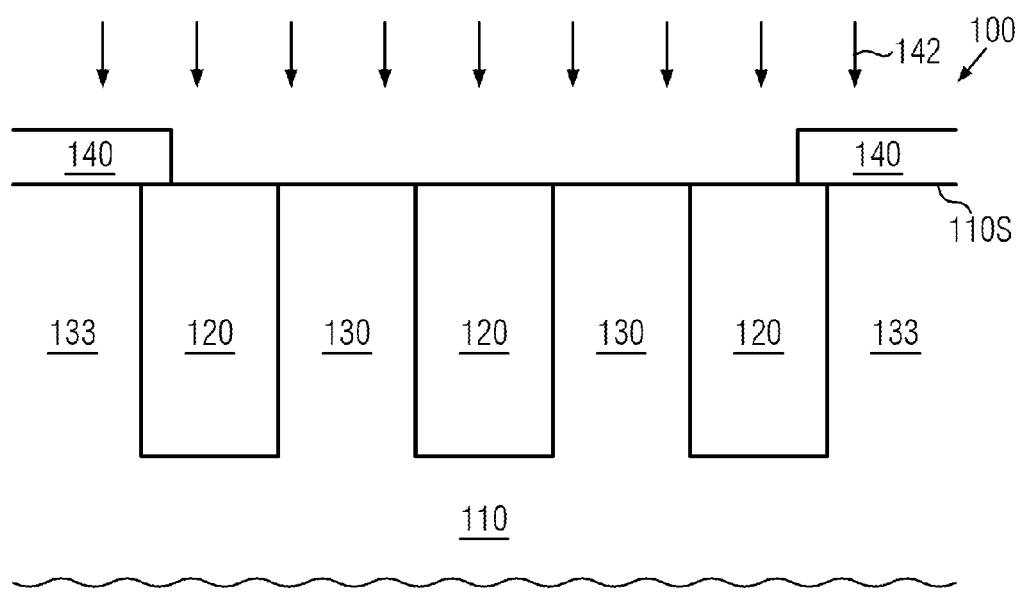

FIG. 1b schematically shows the semiconductor device structure 100 at a more advanced phase of fabrication in accordance with some illustrative embodiments of the present disclosure. In accordance with the illustration in FIG. 1b, insulating trenches 120 comprising, for example, a silicon oxide material, such as $SiO_2$ or the like, separate neighboring fins 130. An active region comprising the plurality of fins 130 and being bordered by the surrounding regions 133 is patterned by a masking structure 140. In accordance with illustrative examples herein, a masking structure 140 or a hard mask may be formed on the surface 110S such that the plurality of fins 130 is exposed for subsequent processing. The masking structure 140 may be formed, for example, by depositing a layer of photoresist material and patterning the layer of photoresist material in accordance with well-known lithography methods for exposing the plurality of fins 130.

Subsequent to providing the masking structure 140 on the surface 110S, an etching process 142 is performed for at least partially exposing sidewall surfaces of the fins 130. In accordance with an illustrative example herein, the etching process 142 may comprise an anisotropic oxide etching step configured such that insulating material of the insulating trenches 120 may be selectively removed with regard to the fins 130.

Figure 1C:
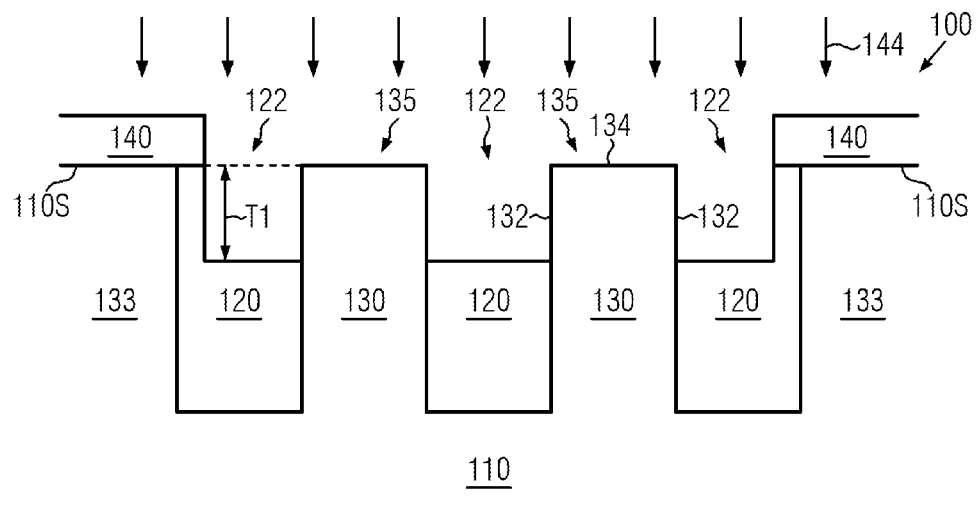

FIG. 1c schematically illustrates the semiconductor device structure 100 of FIG. 1b at a subsequent phase during fabrication in accordance with an illustrative embodiment, particularly after the etching process 142 has been applied to the semiconductor device structure 100 as illustrated in FIG. 1b. As shown in FIG. 1c, after having performed the etching process 142, the semiconductor device structure 100 as illustrated in FIG. 1c may be obtained, wherein the plurality of fins 130 has exposed upper portions comprising exposed sidewall surfaces 132 and an upper surface 134. The person skilled in the art will appreciate that by means of the etching process 142 of FIG. 1b, insulating material of the insulating trenches 120 is removed down to a depth T1 with regard to the surface 110S as indicated by a broken line in FIG. 1c, the depth T1 representing a distance between a bottom of the trench 122 and the broken line in FIG. 1c indicating an upper surface level of an exposed upper surface 135 of the fin 130. The person skilled in the art will appreciate that the trenches 122 are formed at two or more opposing sides of each fin 130, wherein upper portions of the fins 130 are exposed by the trenches 122 as explained above.

In accordance with some illustrative embodiments herein, a shaping process 144 may be applied to the exposed upper portions 135 of the fins 130. In accordance with an illustrative example herein, the shaping process 144 only acts on the exposed upper surface 135 of the fins 130, wherein other areas on the surface 110S of the semiconductor substrate 110 are protected by the masking structure 140 or an according masking pattern (not illustrated). In examples that provide surrounding regions 133, the masking structure 140 may be removed prior to performing the shaping process 144. The person skilled in the art will appreciate that an upper exposed portion of each fin may be thinned by means of the shaping process and subsequently the masking structure 140 may be removed by, for example, an appropriate stripping process (not illustrated).

Figure 1D:
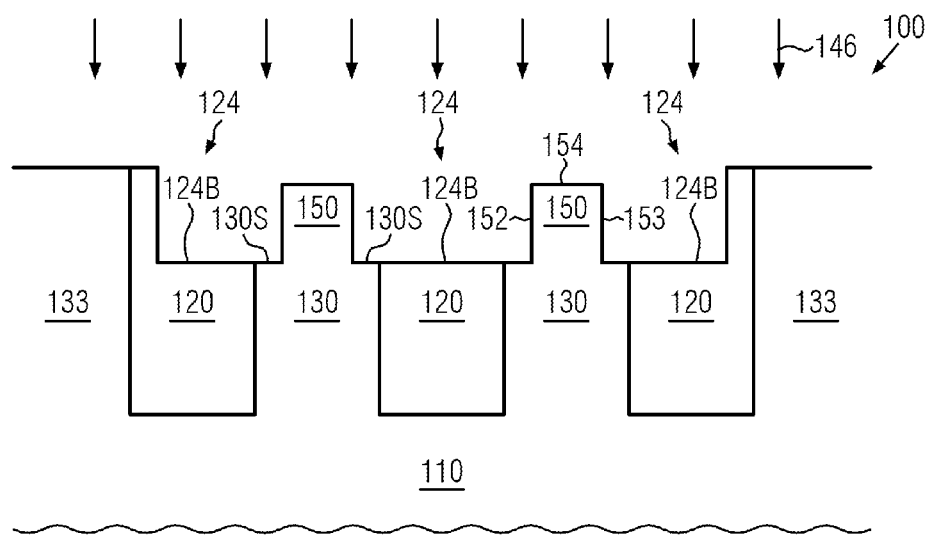

FIG. 1d schematically illustrates, in a cross-sectional view, the semiconductor device structure 100 at a more advanced phase during fabrication in accordance with some illustrative embodiments of the present disclosure and, in particular, subsequent to the application of the shaping process 144 as shown in FIG. 1c. As illustrated in FIG. 1d, the semiconductor device structure 100 comprises shaped exposed upper portions 150 of the fins 130. The shaped exposed upper portions 150 of the fins 130 have at least two exposed sidewall surfaces 152 and 153 at opposing sides of the shaped exposed upper portion 150 and an upper surface 154. As a consequence of the shaping process 144 of FIG. 1c, the trenches 122 of FIG. 1c are increased in size resulting in trenches 124 as illustrated in FIG. 1d such that surface portions 130S almost in alignment with bottom surfaces 124B of the trenches 124 are formed at opposing sides of the fins 130 and effectively increase the bottom of each trench 124.

In accordance with some illustrative embodiments of the present disclosure, a first deposition process 146 may be performed as shown in FIG. 1d. The person skilled in the art will appreciate that this does not pose any limitation to the present disclosure and, in alternative illustrative embodiments of the present disclosure (not illustrated), the first deposition process 146 may be performed instead of the shaping process 144 in FIG. 1c such that the shaping process 144 is omitted.

Figure 1E:
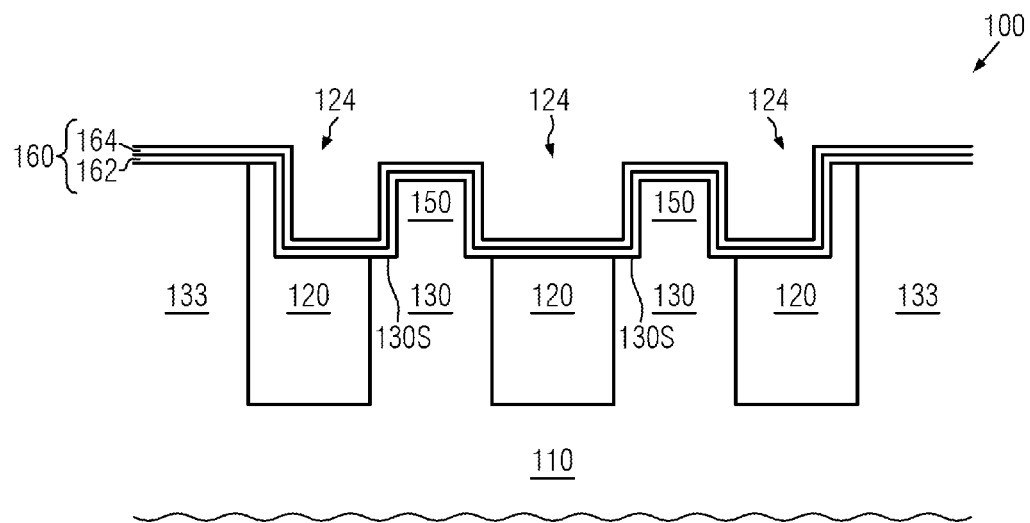

FIG. 1e shows the semiconductor device structure 100 at a more advanced phase during fabrication in accordance with some illustrative embodiments of the present disclosure. In performing the first deposition process 146 (FIG. 1d), a first field-inducing structure 160 is formed on the shaped exposed upper portions 150 of the fins 130 and the surfaces of the trenches 124. In accordance with the illustrative example shown in FIG. 1e, the first field-inducing structure 160 is also formed on surface portions 130S of the fins 130 at opposing sides of the shaped upper portions 150.

In accordance with a special illustrative example, the first field-inducing structure 160 comprises a first oxide layer 162 and a capping layer 164. By way of an explicitly-disclosed illustrative example, the first oxide layer 162 may have charges incorporated therein to form a first charged oxide layer. In a first aspect herein, the first charged oxide layer may be comprised of an oxide layer having aluminum (Al) incorporated therein. The oxide layer may be comprised of at least one of a silicon oxide, such as $SiO_2$ or the like, a hafnium oxide, such as HfO, HfSiO, HfSiON and the like, and a zirconium oxide, such as ZrO, ZrSiO, ZrSiON and the like. The capping layer 164 in accordance with the first illustrative embodiments herein may comprise a titan nitride layer having a thickness in a range of 5-60 Å, and in particular in a range from about 10-30 Å. It is noted that the capping layer 164 does not pose any limitation on the present disclosure and a capping layer above a charged oxide layer may be omitted.

The first deposition process 146 in accordance with a first illustrative embodiment of the first aspect herein may comprise a step for forming a dielectric on the shaped exposed upper portion 150, the dielectric comprising one of a silicon oxide, such as $SiO_2$, together with hafnium oxide, such as HfO, or a hafnium nitride, such as HfN, and a silicon oxide, such as $SiO_2$, together with a zirconium oxide, such as ZrO, or a zirconium nitride, such as ZrN. In the following, some illustrative examples of processes for forming a charged oxide layer will be described which are for illustrative purposes only. In a first example, a capping structure such as titanium nitride/aluminum/titanium nitride layer stack may be subsequently formed by an appropriate physical vapor deposition process. A configuration of the TiN/Al/TiN layer stack may be given by a thickness structure such as about 5-20 Å (TiN)/about 5-10 Å (Al)/about 10-30 Å (TiN). Alternatively in a second example, a titanium aluminum nitride sandwich structure may be deposited by an appropriate atomic layer deposition process. Subsequently (FIG. 1i), an annealing process may be applied with an annealing temperature in a range from about 800-1000° C. and in some preferred embodiments in a range from about 850-950° C. An annealing time may be chosen out of a range from about 5-80 seconds and, in some preferred embodiments, the annealing time may be in a range from about 10-60 seconds. Subsequently (FIG. 1l), a cleaning process such as an SC1 process comprising APM may be applied for removing at least one layer of a titanium nitride comprising material.

A first deposition process in accordance with a second illustrative embodiment of the first aspect herein may comprise an atomic layer deposition process for depositing an oxide layer having aluminum incorporated therein, such as, for example, a hafnium aluminum oxide layer. Subsequently, a titanium nitride capping layer may be formed on the charged oxide layer. The person skilled in the art will appreciate that, alternatively, a capping layer on the charged oxide layer may be omitted.

In a second aspect herein, the first charged oxide layer may be comprised of a dielectric having one of La, Sc, Pr and Nd incorporated therein. The dielectric may be comprised of at least one of a silicon oxide, such as $SiO_2$ or the like, a hafnium oxide, such as HfO, HfSiO, HfSiON and the like, a barium oxide, such as BaO and the like, and a zirconium oxide, such as ZrO, ZrSiO, ZrSiON and the like. The capping layer 164 in accordance with the first illustrative embodiments herein may comprise a titanium nitride layer having a thickness in a range of 5-60 Å, and in particular in a range from about 10-30 Å.

The first deposition process 146 in accordance with a first illustrative embodiment of the second aspect herein may comprise a step for forming an oxide material on the shaped exposed upper portion 150, the oxide material comprising one of a silicon oxide, such as $SiO_2$, together with hafnium oxide, such as HfO, or a hafnium nitride, such as HfN, and a silicon oxide, such as $SiO_2$, together with a zirconium oxide, such as ZrO, or a zirconium nitride, such as ZrN. In the following, some illustrative examples of processes for forming a charged oxide layer will be described which are for illustrative purposes only. In a first example, a capping structure such as a titanium nitride/La/titanium nitride layer stack may be subsequently formed by an appropriate physical vapor deposition process. A configuration of the TiN/La/TiN layer stack may be given by a thickness structure such as about 5-20 Å(TiN)/about 5-10 Å (Al)/about 10-30 Å (TiN). Alternatively, in a second example, a titanium aluminum nitride sandwich structure may be deposited by an appropriate atomic layer deposition process. Subsequently (FIG. 1i), an annealing process may be applied with an annealing temperature in a range from about 800-1000° C. and in some preferred embodiment in a range from about 850-950° C. An annealing time may be chosen out of a range from about 5-80 seconds and, in some preferred embodiments, the annealing time may be in a range from about 10-60 seconds. Subsequently (FIG. 1l), a cleaning process such as an SC1 process comprising APM may be applied for removing at least one layer of a titanium nitride comprising material.

A first deposition process in accordance with a second illustrative embodiment of the second aspect herein may comprise an atomic layer deposition process for depositing an oxide layer having La incorporated therein, such as, for example, a layer of HfLaO. Subsequently, a titanium nitride capping layer may be formed on the charged oxide layer. This does not pose any limitation on the present invention and, alternatively, a capping layer on the charged oxide layer may be omitted.

The person skilled in the art will appreciate that the above description of the second aspect is not limited to the inclusion of La. Alternatively, one of Pr, Sc and Nd may be used instead of La.

Figure 1F:
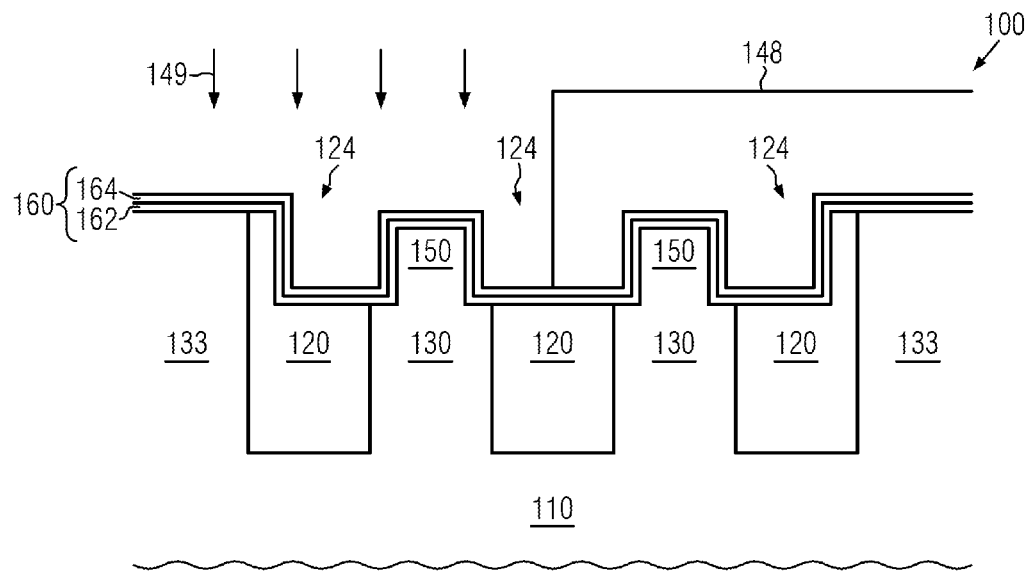

FIG. 1f illustrates the semiconductor device structure 100 at a more advanced phase during fabrication in accordance with some illustrative embodiments of the present disclosure. As shown in FIG. 1f, a mask structure 148 may be formed over a first plurality of the plurality of fins 130, the first plurality of fins comprising at least one fin, such that a second plurality of fins comprising one or more fins is not covered by the masking structure 148. In accordance with an explicitly disclosed illustrative example, the masking structure 148 may be formed by a patterned photoresist material formed above the first plurality of fins.

Next, as shown in FIG. 1f, an etching process 149 is applied to the second plurality of fins for removing the first charged oxide layer structure 160 formed on the first plurality of fins.

Figure 1G:
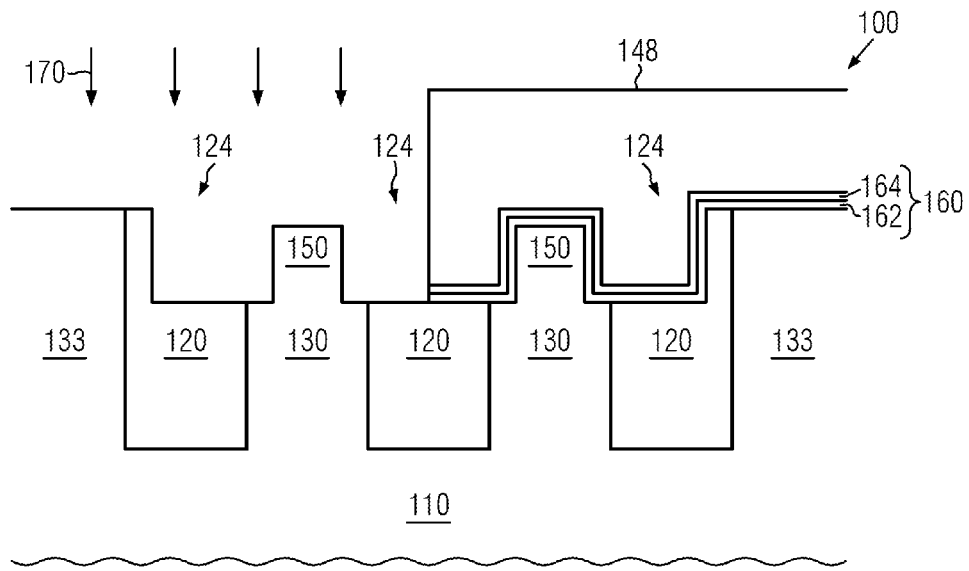

FIG. 1g schematically illustrates, in a cross-sectional view, the semiconductor device structure 100 of FIG. 1f at a later phase of fabrication in accordance with some illustrative embodiments of the present disclosure, particularly after the etching process 149 (FIG. 1f) has been applied to the second plurality of fins. As shown in FIG. 1g, the first oxide layer structure 160 is removed from the second plurality of fins, while the masking structure 148 protects the first plurality of fins and in particular the first oxide layer structure 160 formed above the first plurality of fins such that the first field-inducing structure 160 is not removed from above the first plurality of fins.

Subsequently, a second deposition process 170 is applied to the second plurality of fins in alignment with the masking structure 148 covering the first plurality of fins. The second deposition process may be performed in accordance with techniques as described with regard to the first deposition process 146 above. The person skilled in the art will appreciate that, in CMOS applications, the second deposition process 170 may be configured in a complementary way, particularly such that the second deposition process 170 is configured for depositing a field-inducing structure implementing a field effect complementary to the field effect induced by the first field-inducing structure formed by the first deposition process 146 in FIG. 1d.

In accordance with an explicitly disclosed embodiment, a layer comprising one of HfO, ZrO and $SiO_2$ may be formed as a preferably defective dielectric layer for enabling one of Al, La, Sc, Pr and Nd as being incorporated therein by bonding to defects, for example, during the first deposition process 146 as shown in FIG. 1d. In an illustrative example herein, the defective layer may be indicated by reference numeral 162 in FIG. 1e. According to a first illustrative embodiment, an Al/TiN stack configuration (see discussion of the first aspect of the first deposition process above) may be deposited and patterned by an appropriate masking structure, such as for forming a cap 164 as shown in FIG. 1e. The Al/TiN stack configuration may be removed in accordance with the masking structure by, for example, a SC1 cleaning process and a La/TiN stack configuration may be subsequently formed in accordance with the masking structure. Subsequently, an annealing process (as previously described with regard to FIG. 1e and as illustrated in FIG. 1i) and a cleaning process (FIG. 1l), for example SC1, may be performed for removing Al/La layers during later processing. Furthermore, the active silicon may be cleaned up by removing HfO with HF. According to a second illustrative example herein, a TiN/La/TiN stack configuration (see discussion of the second aspect of the first deposition process above) may be deposited and patterned by an appropriate masking structure. The TiN/La/TiN stack configuration may be removed in accordance with the masking structure by, for example, a SC1 cleaning process and an Al/TiN stack configuration is subsequently formed in accordance with the masking structure. Subsequently, an annealing process (FIG. 1*i*) as previously described and a cleaning process (FIG. 1*l*), for example SC1, may be performed for removing Al/La layers during later processing. Furthermore, the active silicon may be cleaned up by removing HfO with HF. The person skilled in the art will appreciate that one of Sc, Pr and Nd may be alternatively used instead of La or Al.

Figure 1H:
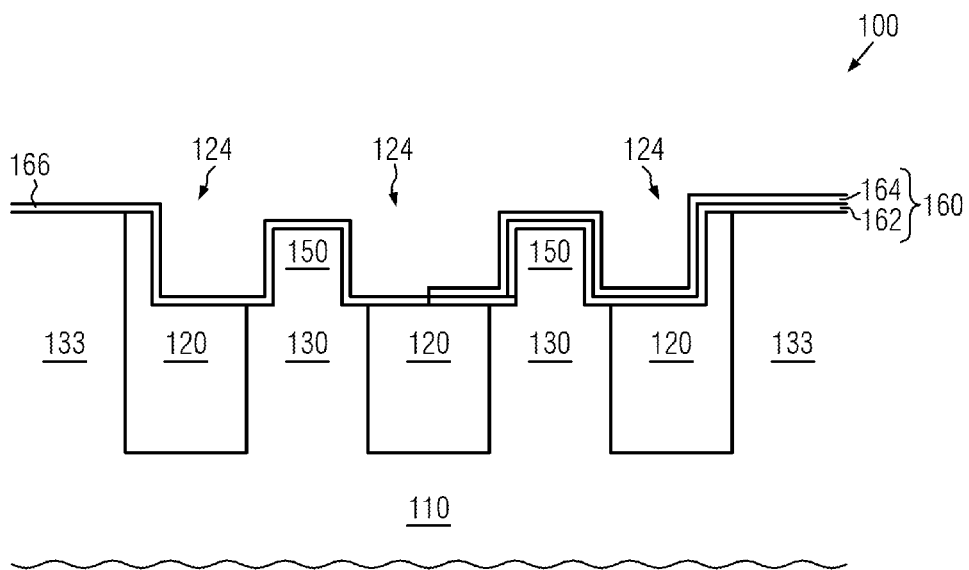
Figure 1I:
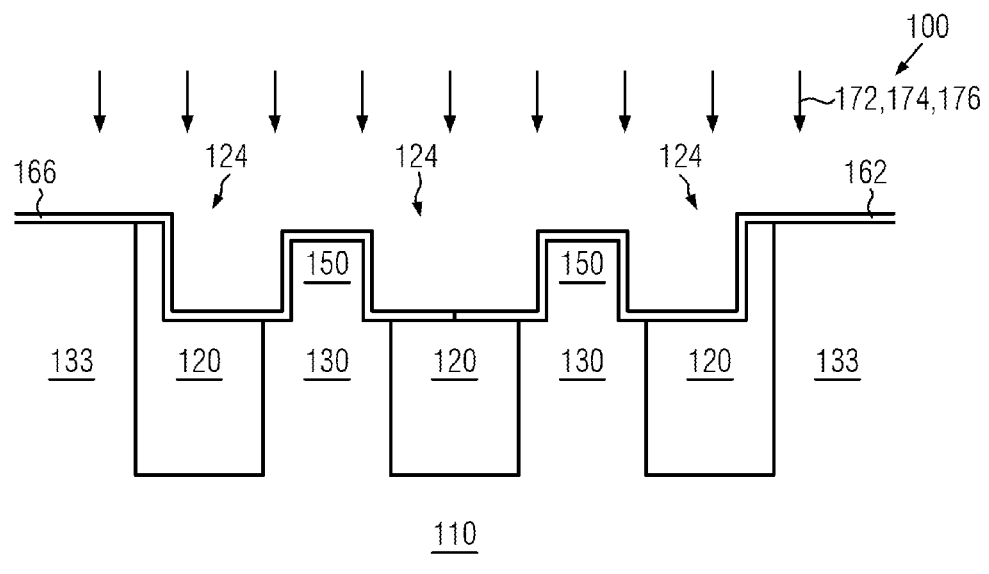

FIG. 1*h* schematically illustrates, in a cross-sectional view, the semiconductor device structure 100 at a more advanced phase during fabrication in accordance with some illustrative embodiments of the present disclosure. Particularly, FIG. 1*h* illustrates the semiconductor device structure 100 subsequent to the application of the second deposition process 170. As illustrated, a second field-inducing structure 166 is formed on the second plurality of fins. In an explicitly-disclosed illustrative example, the field-inducing structure 166 may comprise a second charged oxide layer which has charges incorporated into an oxide in accordance with the preceding explanations in this regard. Alternatively, the second field-inducing structure 166 may comprise an oxide layer having a capping layer formed thereon.

FIG. 1*i* schematically illustrates, in a cross-sectional view, the semiconductor device structure 100 in a more advanced phase of a fabrication in accordance with some illustrative embodiments of the present disclosure, particularly subsequent to the formation of the second field-inducing structure 166. As shown, the semiconductor device structure 100 at this stage in the fabrication comprises two field-inducing structures 162 and 166 formed on the respective first and second pluralities of fins after removing the masking structure 148 (FIG. 1*h*) and the capping layer 164 (FIG. 1*h*). The person skilled in the art will appreciate that removing the capping layer, i.e., a TiN layer, may be achieved by applying a cleaning process, such as a SC1 cleaning process with APM in accordance with illustrative examples.

Subsequently, a sequence of processes 172, 174 and 176 may be applied to the semiconductor device structure 100 as illustrated in FIG. 1*i*. The process 172 may comprise a filling step for filing the trenches 124 with insulating material, for example a silicon oxide material such as $SiO_2$.

Process 174 may comprise a planarization step for planarizing the insulating material filled into the trenches 124 until upper surfaces of the surrounding regions 133 are exposed. In an exemplary embodiment, a SiN layer may remain on top of Si until a polishing process is completed, followed removing the SiN layer afterwards.

Process 176 may comprise an annealing step for fixing the charges within the field-inducing structures 166 and 162. However, this does not pose any limitation on the present disclosure and the person skilled in the art will appreciate that the process 176 comprising an annealing step may be applied at a different stage in the process flow, e.g., it may be combined with gate oxide formation at more advanced phases of the fabrication in accordance with an explicit illustrative example. According to illustrative examples herein, the annealing step may be configured as described above.

Figure 1J:
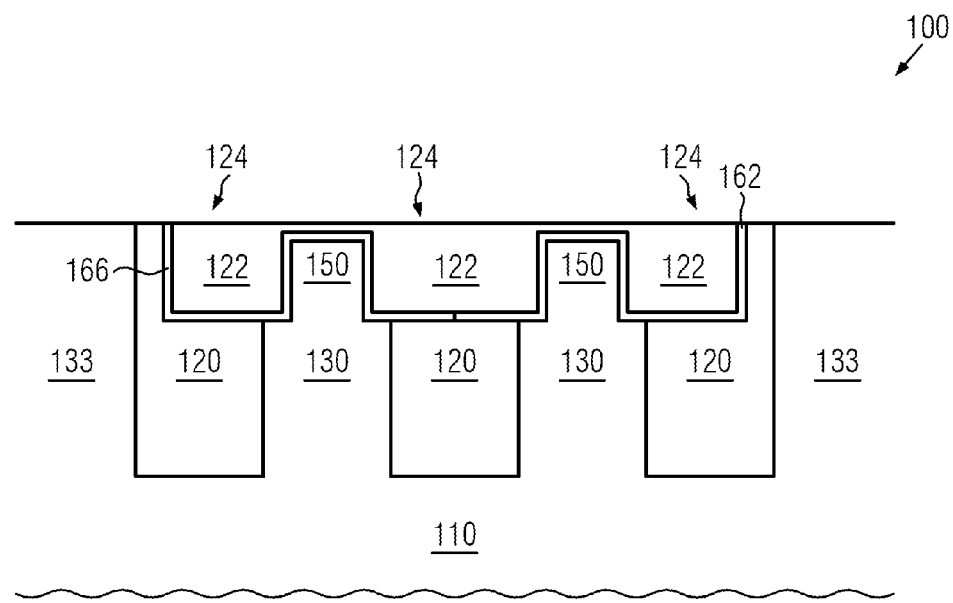

FIG. 1*j* schematically illustrates the semiconductor device structure in a more advanced phase during fabrication in accordance with some illustrative embodiments of the present disclosure. Particularly, the semiconductor device structure of FIG. 1*j* is shown after having performed the sequence of processes 172, 174 and 176. As illustrated, the trenches 124 are filled with an insulating material to form an insulating layer 122 on the field-inducing structures 166 and 162.

Figure 1K:
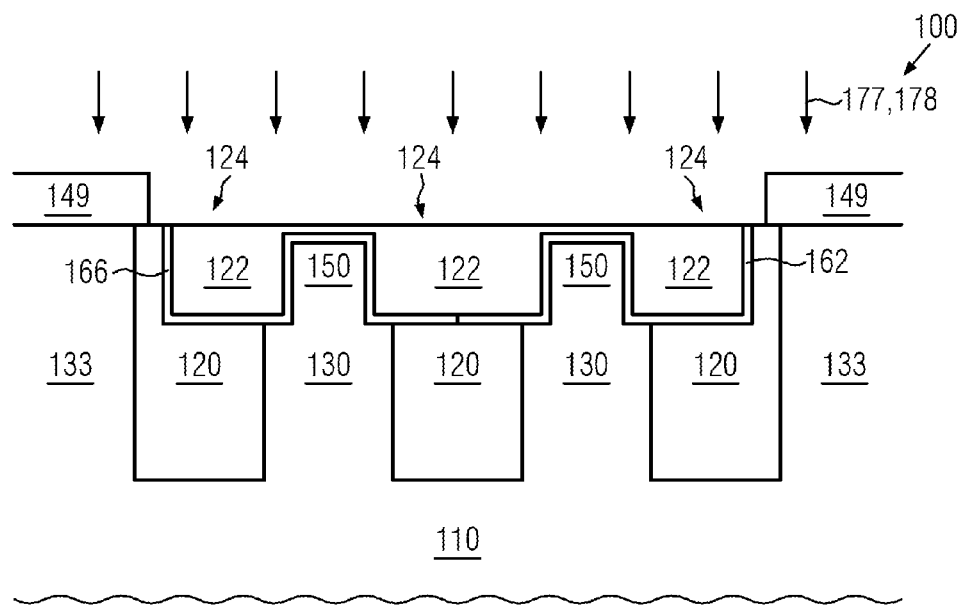

FIG. 1*k* schematically illustrates the semiconductor device structure 100 in a more advanced phase during fabrication in accordance with some illustrative embodiments of the present disclosure. Particularly, the semiconductor device structure 100 is illustrated at a stage subsequent to the formation of an insulating layer 122 above the field-inducing structures 162 and 166. As shown in FIG. 1*k*, a mask structure 149 is formed over the semiconductor substrate 110 such that the plurality of fins 130 is exposed while the surrounding regions 133 is at least partially covered by the masking structure 149.

Subsequently, a process 177 for partially removing insulating material from the insulating layer 122 formed above the field-inducing structures 162 and 166 is performed such that the field inducing structures 162 and 166 are partially exposed down to a depth T2 (FIG. 1*l*) of the insulating layer 122 with regard to an upper surface 154 (FIG. 1*l*) of the shaped exposed upper portions 150.

In a subsequent etching process 178, exposed field-inducing structures, i.e., field-inducing structures that are not covered by the insulating material of the insulating layer 122, are removed to expose the upper surface 154 of the shaped exposed upper portions 150 and to partially expose the sidewall surfaces 152 and 153 (FIG. 1*d*) of the shaped exposed upper portions 150 such that exposed sidewall surface portions 152' and 153' (FIG. 21) are formed which partially expose the shaped upper portions 150. In an explicitly disclosed illustrative example, the etching process 178 may be configured in accordance with a cleaning process, such as SC1 comprising APM, to remove the exposed field-inducing structures 162 and 166.

Figure 1L:
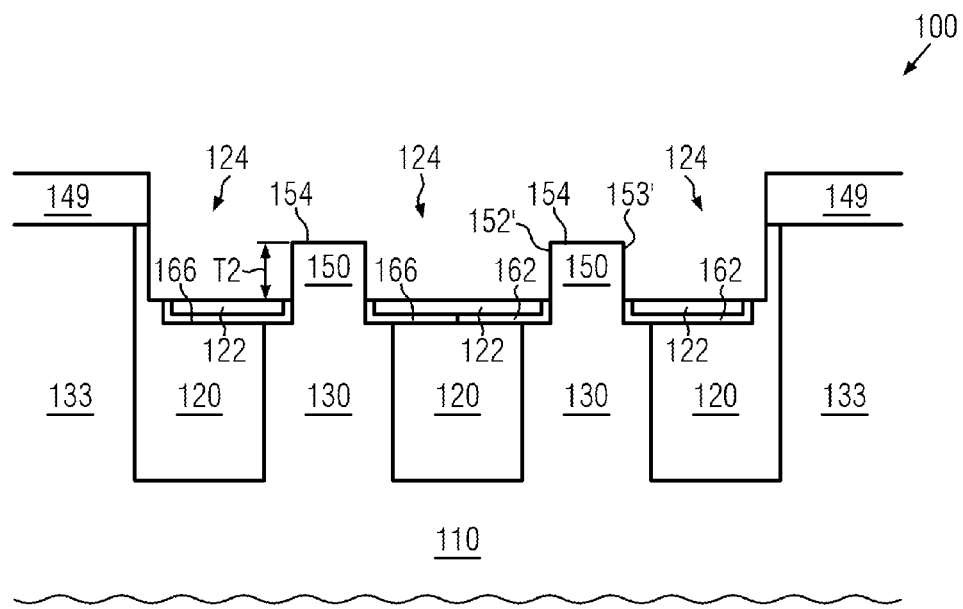
Figure 1M:
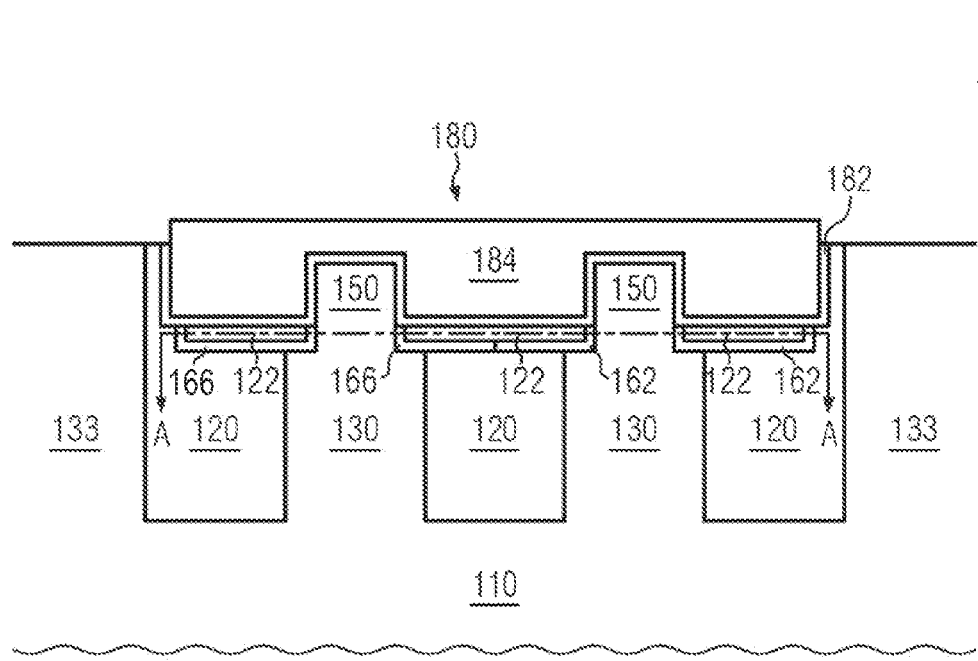

FIG. 1*m* schematically illustrates, in a cross-sectional view, the semiconductor device structure 100 in a more advanced phase during fabrication in accordance with some illustrative embodiments of the present disclosure. Particularly, the semiconductor device structure 100 of FIG. 1*m* is shown at an advanced stage during fabrication subsequent to a partial removal of the insulating layer 122 and the field-inducing structures 162 and 166 to partially expose the shaped upper portions 150 as shown in FIG. 1*l*. More particularly, the semiconductor device structure 100 as shown in FIG. 1*m* comprises a gate structure 180 formed over the shaped exposed upper portions 150 of the fins 130 so as to cover active fin portions. The gate structure 180 may comprise, in accordance with some illustrative examples, a gate dielectric 182 and a gate electrode 184 formed on the active fin portions of the shaped upper portions 150.

Figure 1N:
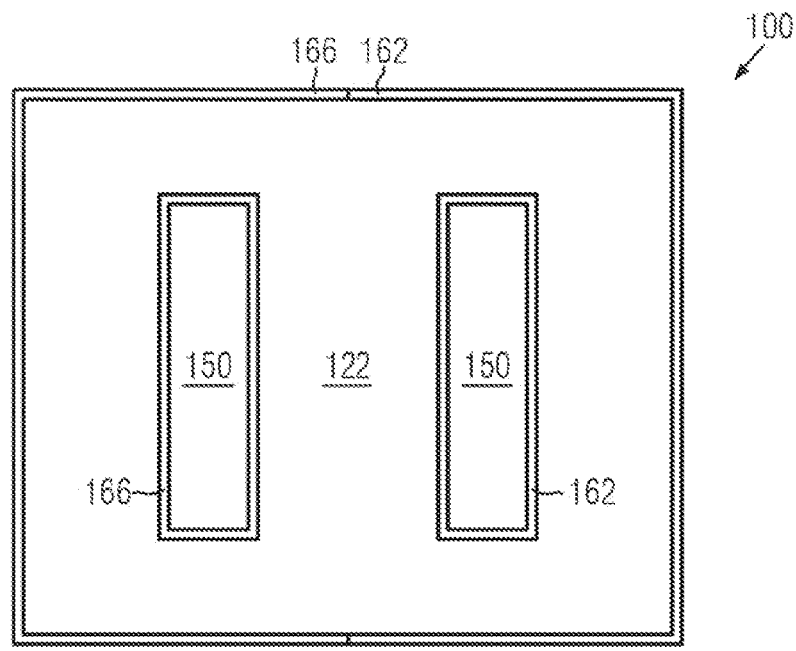
FIG. 1n schematically illustrates a top view of a semiconductor device structure according to an illustrative embodiment of the present disclosure.

A top view of a cross-section along the line AA in FIG. 1*m* is illustrated in FIG. 1*n*. FIG. 1*m* schematically shows a cross-sectional top view on the shaped upper portions 150. In accordance with the embodiment illustrated in FIG. 1*n*, the shaped upper portions 150 are surrounded by respective field-inducing structures 162 and 166 separating the shaped upper portions 150 from the surrounding insulating material of the insulating layer 122. Furthermore, the whole plurality of shaped upper portions 150 is surrounded by the field-inducing structures 162, 166 enclosing the plurality of the shaped upper portions 150 at a depth between T1 and T2 (see FIGS. 1*c* and 1*l* with regard to T1 and T2).

Figure 2:
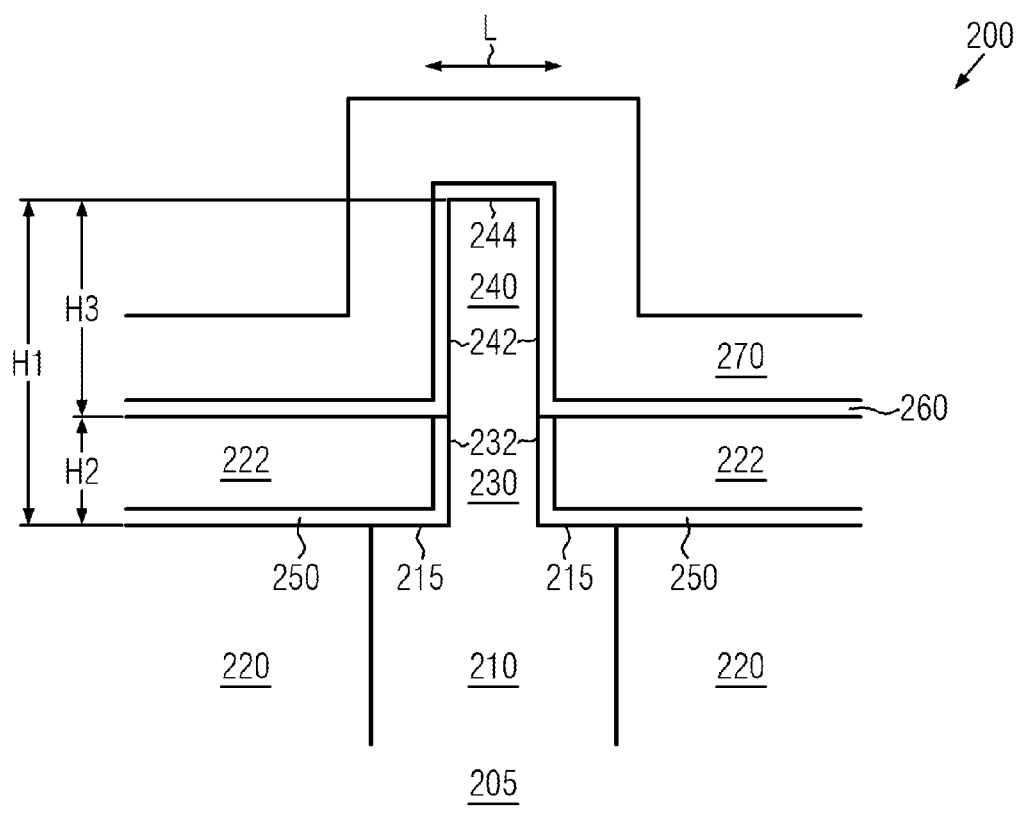
FIG. 2 schematically illustrates a cross-sectional view of an active fin portion in accordance with an illustrative embodiment of the present disclosure.

A semiconductor device structure 200 in accordance with an explicitly disclosed illustrative embodiment of the present disclosure is schematically shown in a cross-sectional view in FIG. 2. The semiconductor device structure 200 comprises a semiconductor substrate 205 and a fin 210 formed in the semiconductor substrate 205. An upper portion 230 of the fin 210 is shaped with regard to the remainder of the fin 210 below the upper portion 230 such that the fin 210 has a first shape along a height direction parallel to a normal direction of an upper surface 244 of the upper portion 230, 240, particularly of a first portion 240 of the upper portion 230, 240 disposed on a second portion 230 of the upper portion 230, 240 along a height dimension H1. The first portion 240 having a height H3 smaller than height H1 of the upper portion 230, 240 defines an active portion of the fin 210. The second portion 230 of the upper portion 230, 240 extending along a height dimension H2 represents a field-inducing portion of the fin 210 having a field-inducing structure 250 formed on sidewall surfaces 232 of the second portion 230. Due to the different shape of the upper portion 230, 240 relative to the remainder of the fin 210, upper sidewall surfaces 215 of the remainder of the fin 210 are disposed at opposing sides of the upper portion 230, 240, and particularly at opposing sides of the second portion 230 such that the field-inducing structure 250 is formed on the upper surface portions 215. Therefore, the field-inducing structure 250 assumes a general L-shape and the person skilled in the art will appreciate that, depending on the shape of the upper portion 230, 240 of the fin 210 with regard to the remainder of the fin 210, the L-shape of the field-inducing structure 250 may resemble a deformed L shape. A first insulating layer 222 is formed on the field-inducing structure 250 such that the field-inducing structure 250 is sandwiched between the first portion 230 and the first insulating layer 222 and the field-inducing layer is sandwiched between the first insulating layer 222 and an isolating trench 220. On the field-inducing structure 250, the first insulating layer 222 and on sidewall surfaces 242 and the upper surface 244 of the first portion 240 there is formed a gate structure comprising a gate dielectric 260 and a gate electrode 270. The person skilled in the art will appreciate that the height H3 of the first portion 240 representing an active fin region may be adjusted by appropriately defining a height H2 of the field-inducing structure 250 along the sidewall surfaces 232 of the second portion 230.

The person skilled in the art will appreciate that the field-inducing structures 250 induce a field effect in the second portion 230 such that leakages from the first portion 240 representing a channel region of the semiconductor device structure 200 into the semiconductor substrate 205 below may at least be suppressed if not avoided and origins for doping fluctuations by the doping of the fin 210 below the upper portion 230, 240 extending into the first portion 240 is suppressed if not avoided by the region where the field effect is induced in the second portion 230 by the field-inducing structure 250. The person skilled in the art will appreciate that a channel height of a channel provided by the first portion 240 of the semiconductor device structure 200 may extend in parallel to height dimension as indicated by the height H1 in FIG. 2 and a width of the channel provided by the first portion 240 of the semiconductor device structure 200 may be defined by a length dimension oriented perpendicularly to the height dimension and a normal to the paper plane of the cross-sectional view as illustrated in FIG. 2, i.e., as indicated by the arrow denoted by L in FIG. 2.

Figure 3A:
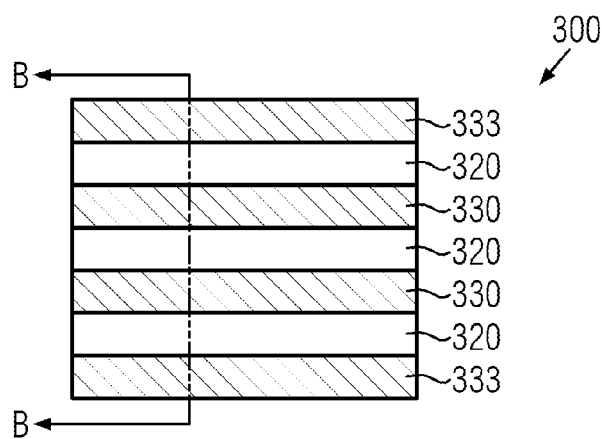
FIGS. 3a-3c schematically illustrate a process for forming semiconductor device structures in accordance with an alternative embodiment of the present disclosure.
Figure 3B:
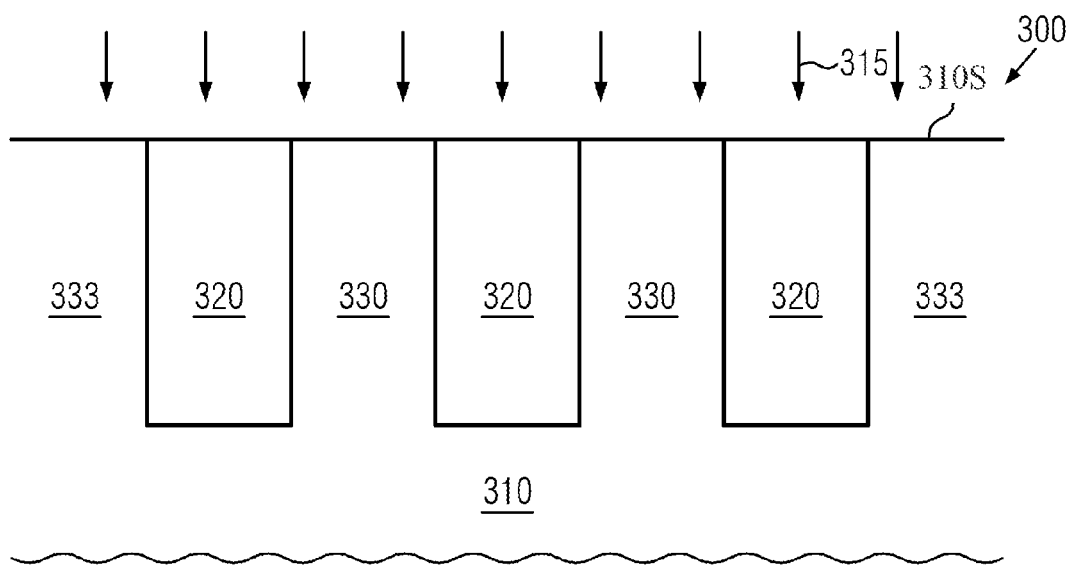
Figure 3C:
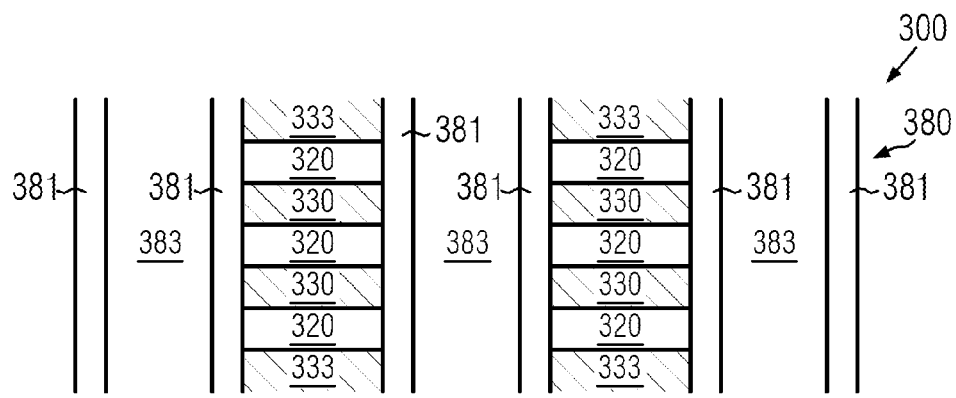

With regard to FIGS. 3a-3c, an alternative illustrative embodiment of the present disclosure will be briefly discussed. An according process may be performed along the lines of the disclosure of unpublished U.S. patent application Ser. No. 13/454,433, the disclosure of which is completely incorporated by reference. FIG. 3a schematically illustrates a top view on a semiconductor device structure 300 at an early phase of processing, wherein a plurality of fins 330, 333 are formed in a semiconductor substrate (not illustrated), the plurality of fins 330, 333 being delineated by trenches 320 formed in between. FIG. 3b illustrates a cross-sectional view to the illustration in FIG. 3a along the line BB of FIG. 3a. As illustrated in FIG. 3b, a process 315 may be performed to form gate structures (380 in FIG. 3c) on the semiconductor device structure 300 as illustrated in FIG. 3b such that the gate structures are aligned transversely with regard to the fins 330, 333 and are formed on an upper surface 310s of the semiconductor substrate 310. FIG. 3c schematically illustrates a top view on the semiconductor device structure 300 of FIG. 3b subsequent to the formation process 315, wherein the gate structures 380 are formed on the surface 310S (FIG. 3b). Particularly, dummy gates 383 are formed transversely to the underlying fins 333, 330 and the underlying trenches 320. The person skilled in the art will appreciate that further processing in accordance with the presently discussed embodiment may continue by masking the fins 330, 333 and trenches 320 between the dummy gates 383 and removing the dummy gate 383 with regard to sidewall spacer 381 to form gate trenches 383 delineated by the sidewall spacer 381 such that the fins 330, 333 are exposed within the gate trenches 383. The person skilled in the art will appreciate that, subsequently, a field-inducing structure may be formed within the gate trenches 383 in accordance with the illustrative embodiments as discussed with regard to FIGS. 1a-1l above. The person skilled in the art will appreciate that subsequently to having formed the field-inducing structures within the gate trenches 383, formation of gate electrodes may continue as discussed within the above referred-to U.S. patent application. For the sake of brevity, further details are not repeated.

The present disclosure provides for methods for forming semiconductor device structures having field-inducing structures for inducing a permanent field effect within the semiconductor device structures. In accordance with some special illustrative embodiments, the field-inducing structures may be provided by charged oxide layers before forming a gate dielectric. The person skilled in the art will appreciate that illustrative examples herein provide a formation process for forming charged oxide layers by forming a dielectric layer, forming at least one layer thereon comprising one of aluminum, lanthanum, barium, scandium, praseodymium, neodymium and the like, applying a thermal anneal process for fixing the charges within the oxide layer and applying a cleaning process for exposing the charged oxide layer. In alternative illustrative examples, an oxide layer comprising one of aluminum, lanthanum, barium, scandium, praseodymium, neodymium and the like incorporated therein may be formed by an appropriate deposition process. The person skilled in art will appreciate that the oxide layer may comprise at least one of a silicon oxide, a silicon nitride, a hafnium oxide, a hafnium silicon oxide, a hafnium silicon oxynitride, barium oxide, zirconium oxide, zirconium silicon oxide and zirconium silicon oxynitride.

Although some illustrative examples are explained with regard to application of a shaping process, the person skilled in the art will appreciate that no limitation of the present invention is intended, instead, illustrative embodiments may be provided which do not comprise a shaping of an exposed upper portion of a fin.

It is understood that the order of steps may be changed in the above description and some steps may be even omitted in accordance with some illustrative examples of the present disclosure. In the above description, numerous specific details are set forth such as, for example, thicknesses, in order to provide a more thorough understanding of the present disclosure. Those skilled in the art will realize that the numerous specific details as provided may be equipment specific and may accordingly vary from one brand of equipment to another. It will be obvious, however, to one skilled in the art that the present disclosure may be practiced without these details. In other instances, well-known processes have not been described in detail in order to not unnecessarily obscure the present disclosure.

Although this invention has been described relative to specific insulating materials, conductive materials and deposited materials and etching of these materials, it is not limited to the specific materials but only to their specific characteristics, such as conformal and nonconformal, and capabilities, such as depositing and etching. Other materials may be substituted as is well understood by those skilled in the arts after appreciating the present disclosure.

Given the variety of embodiments of the present disclosure just described, the above description and illustrations shown should not be taken as limiting the scope of the present disclosure or of the present invention as defined by the claims.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor device structure, comprising:
a fin formed in a semiconductor substrate, said fin comprising an upper fin portion having opposing sidewall surfaces, wherein each of said opposing sidewall surfaces has a lower sidewall portion and an upper sidewall portion that extends continuously upward from said lower sidewall portion;
a field-inducing structure that is adapted to induce a field effect in said fin, wherein said field-inducing structure is positioned on and covers at least one of said lower sidewall portions but is not positioned on and does not cover said upper sidewall portions;
a gate dielectric layer that is positioned on and covers each of said upper sidewall portions but is not positioned on and does not cover said at least said one of said lower sidewall portion; and
an insulating layer, wherein said insulating layer covers said field-inducing structure and is positioned between said field-inducing structure and said gate dielectric layer.

2. The semiconductor device structure of claim 1, wherein said fin further comprises a lower fin portion positioned below said upper fin portion, said lower fin portion extending continuously downward from said upper fin portion to said semiconductor substrate, wherein opposing sidewall surfaces of said lower fin portion are laterally offset from said opposing sidewall surfaces of said upper fin portion.

3. The semiconductor structure of claim 2, wherein said laterally offset opposing sidewall surfaces of said upper and lower fin portion define opposing fin sidewalls, each of said opposing fin sidewalls having a stepped configuration.

4. The semiconductor structure of claim 1, wherein said field-inducing structure comprises one of lanthanum (La), barium (Ba), scandium (Sc), praseodymium (Pr), neodymium (Nd) and aluminum (Al) incorporated into one of SiO2, HfO, HfSiO, HfSiON, ZrO, BaO, ZrSiO and ZrSiON.

5. The semiconductor structure of claim 1, wherein said gate dielectric layer is positioned on and covers an uppermost surface of said field-inducing structure, said upper surface of said field-inducing structure being laterally adjacent to and level with an interface between said upper and lower sidewall portions of said opposing sidewall surfaces.

6. A semiconductor device structure, comprising:
a fin positioned on a semiconductor substrate, said fin having an upper portion and a lower portion, said lower portion being positioned between said upper portion and said semiconductor substrate, said upper and lower portions of said fin each having at least two opposing sidewall surfaces;
a field-inducing structure, wherein said field-inducing structure is positioned on and covers said at least said two opposing sidewall surfaces of said lower portion of said fin but is not positioned on and does not cover said at least said two opposing sidewall surfaces of said upper portion of said fin;
a gate insulation layer of a gate structure positioned on and in contact with said at least said two opposing sidewall surfaces of said upper portion of said fin and on and in contact with an upper surface of said field-inducing structure; and
a gate electrode positioned above said gate insulation layer.

7. The semiconductor structure of claim 6, wherein said field-inducing structure comprises one of lanthanum (La), barium (Ba), scandium (Sc), praseodymium (Pr), neodymium (Nd) and aluminum (Al) incorporated into one of $SiO_2$, HfO, HfSiO, HfSiON, ZrO, BaO, ZrSiO and ZrSiON.

8. The semiconductor structure of claim 6, wherein said upper portion of said fin has a vertical height that is greater than a vertical height of said lower portion of said fin.

9. The semiconductor structure of claim 6, wherein said field-inducing structure is positioned on and in contact with all sidewall surfaces of said lower portion of said fin so as to surround said lower portion of said fin.

10. The semiconductor structure of claim 6, wherein, when viewed in cross section, said upper and lower portions of said fin have substantially the same lateral width throughout a combined vertical height of said upper and lower portions of said fin.

11. The semiconductor structure of claim 6, wherein said field-inducing structure contacts an upper surface of said semiconductor substrate and an upper surface of an insulating material positioned adjacent said semiconductor substrate.

12. The semiconductor structure of claim 6, wherein a lower end of said upper portion of said fin forms an integrally contiguous interface with an upper end of said lower portion of said fin, said upper surface of said field-inducing structure being laterally adjacent to and level with said integrally contiguous interface.

13. The semiconductor structure of claim 6, further comprising a layer of insulating material positioned between said field-inducing structure and said gate insulation layer, said layer of insulating material directly contacting sidewall surfaces of said field-inducing structure and a bottom surface of said gate insulation layer.

14. A semiconductor device structure, comprising:
a fin positioned on a semiconductor substrate, said fin having an upper portion and a lower portion, said lower portion being positioned between said upper portion and said semiconductor substrate, said upper and lower portions of said fin each having at least two opposing sidewall surfaces;

a first insulating material positioned adjacent said semiconductor substrate;

a field-inducing structure, wherein said field-inducing structure is positioned on and covers said at least said two opposing sidewall surfaces of said lower portion of said fin, an upper surface of said semiconductor substrate, and an upper surface of said first insulating material but is not positioned on and does not cover said at least said two opposing sidewall surfaces of said upper portion of said fin;

a second insulating material positioned on said field-inducing structure;

a gate insulation layer of a gate structure positioned on and in contact with said at least two opposing sidewall surfaces of said upper portion of said fin, on and in contact with an upper surface of said field-inducing structure, and on and in contact with an upper surface of said second insulating material; and a gate electrode positioned above said gate insulation layer.

15. The semiconductor structure of claim 14, wherein said field-inducing structure comprises one of lanthanum (La), barium (Ba), scandium (Sc), praseodymium (Pr), neodymium (Nd) and aluminum (Al) incorporated into one of $SiO_2$, HfO, HfSiO, HfSiON, ZrO, BaO, ZrSiO and ZrSiON.

16. The semiconductor structure of claim 14, wherein said upper portion of said fin has a vertical height that is greater than a vertical height of said lower portion of said fin.

17. The semiconductor structure of claim 14, wherein said field-inducing structure is positioned on and in contact with all sidewall surfaces of said lower portion of said fin so as to surround said lower portion of said fin.

18. The semiconductor structure of claim 14, wherein said upper surface of said field-inducing structure and said upper surface of said second insulating material are positioned approximately level with one another.

19. The semiconductor structure of claim 14, wherein said second insulating material is positioned between said gate insulation layer and said field-inducing structure.

20. The semiconductor structure of claim 14, wherein said gate insulation layer further contacts an upper surface of said upper portion of said fin.

21. The semiconductor structure of claim 14, wherein a lower end of said upper portion of said fin forms an integrally contiguous interface with an upper end of said lower portion of said fin, said upper surface of said field-inducing structure being laterally adjacent to and level with said integrally contiguous interface.

22. A semiconductor device structure, comprising:

a fin positioned on a semiconductor substrate, said fin having an upper portion and a lower portion, said lower portion being positioned between said upper portion and said semiconductor substrate, said upper and lower portions of said fin each having at least two opposing sidewall surfaces;

a field-inducing structure positioned on said at least said two opposing sidewall surfaces of said lower portion of said fin, wherein said field-inducing structure contacts an upper surface of said semiconductor substrate and an upper surface of an insulating material positioned adjacent said semiconductor substrate;

a gate insulation layer of a gate structure positioned on and in contact with said at least two opposing sidewall surfaces of said upper portion of said fin and on and in contact with an upper surface of said field-inducing structure; and a gate electrode positioned above said gate insulation layer.

* * * * *